(12) United States Patent
Rau et al.

(10) Patent No.: US 8,767,403 B2
(45) Date of Patent: Jul. 1, 2014

(54) FRAME HAVING FRAME BLADES THAT PARTICIPATE IN COOLING MEMORY MODULES

(75) Inventors: Timothy Rau, Sacramento, CA (US); Glenn C. Simon, Auburn, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 357 days.

(21) Appl. No.: 13/260,207

(22) PCT Filed: Oct. 30, 2009

(86) PCT No.: PCT/US2009/062760
§ 371 (c)(1),
(2), (4) Date: Sep. 23, 2011

(87) PCT Pub. No.: WO2011/053311
PCT Pub. Date: May 5, 2011

(65) Prior Publication Data
US 2012/0020004 A1  Jan. 26, 2012

(51) Int. Cl.
*H05K 7/20* (2006.01)
(52) U.S. Cl.
USPC .......................................................... 361/721
(58) Field of Classification Search
CPC .............. H01L 23/367; H05K 7/20772; H05K 7/20509
USPC .................................................. 361/688–721
See application file for complete search history.

(56) References Cited

U.S. PATENT DOCUMENTS

| | | | | |
|---|---|---|---|---|
| 5,684,675 A * | 11/1997 | Taniguchi et al. | | 361/704 |
| 5,815,371 A * | 9/1998 | Jeffries et al. | | 361/704 |
| 6,055,157 A * | 4/2000 | Bartilson | | 361/699 |
| 6,201,699 B1 * | 3/2001 | Ayres et al. | | 361/707 |
| 6,330,160 B1 * | 12/2001 | Ayres et al. | | 361/707 |
| 6,424,532 B2 * | 7/2002 | Kawamura | | 361/708 |
| 6,496,375 B2 * | 12/2002 | Patel et al. | | 361/719 |
| 6,775,139 B2 * | 8/2004 | Hsueh | | 361/697 |
| 7,023,701 B2 * | 4/2006 | Stocken et al. | | 361/704 |
| 7,106,595 B2 * | 9/2006 | Foster et al. | | 361/721 |
| 7,151,669 B2 * | 12/2006 | Liu | | 361/707 |
| 7,289,331 B2 * | 10/2007 | Foster et al. | | 361/719 |
| 7,342,797 B2 | 3/2008 | Kamath et al. | | |
| 7,446,410 B2 * | 11/2008 | Wehrly et al. | | 257/707 |
| 7,480,147 B2 * | 1/2009 | Hoss et al. | | 361/721 |
| 7,679,913 B2 * | 3/2010 | Hsieh | | 361/704 |
| 7,791,881 B2 * | 9/2010 | Chou et al. | | 361/695 |
| 7,821,785 B1 * | 10/2010 | Neumann | | 361/679.47 |
| 7,933,125 B2 * | 4/2011 | Wei et al. | | 361/699 |
| 8,004,841 B2 * | 8/2011 | Cipolla et al. | | 361/699 |
| 8,081,473 B2 * | 12/2011 | Cipolla et al. | | 361/719 |
| 8,385,069 B2 * | 2/2013 | Iyengar et al. | | 361/700 |
| 8,570,744 B2 * | 10/2013 | Rau et al. | | 361/702 |
| 2006/0221573 A1 * | 10/2006 | Li | | 361/704 |
| 2006/0250772 A1 * | 11/2006 | Salmonson et al. | | 361/698 |
| 2007/0070607 A1 * | 3/2007 | Goodwin | | 361/719 |
| 2008/0084668 A1 | 4/2008 | Campbell et al. | | |

(Continued)

OTHER PUBLICATIONS

International Search Report, PCT/US2009/062760, Jul. 20, 2011 10 pages.

*Primary Examiner* — Adrian S Wilson

(57) ABSTRACT

A frame has frame blades arranged to be interleaved with memory modules or memory module sockets. The frame blades participate in cooling the memory modules when memory modules are installed.

15 Claims, 8 Drawing Sheets

(56) References Cited

U.S. PATENT DOCUMENTS

| | | |
|---|---|---|
| 2008/0259567 A1* | 10/2008 | Campbell et al. ............. 361/699 |
| 2008/0264613 A1 | 10/2008 | Chu |
| 2008/0285229 A1* | 11/2008 | Watanabe et al. ............. 361/687 |
| 2008/0291630 A1* | 11/2008 | Monh et al. .................. 361/700 |
| 2009/0002951 A1* | 1/2009 | Legen et al. .................. 361/715 |
| 2009/0168356 A1* | 7/2009 | Chen et al. .................... 361/709 |
| 2009/0190303 A1* | 7/2009 | Chu et al. ................. 361/679.47 |
| 2009/0237883 A1* | 9/2009 | Wei et al. ...................... 361/699 |
| 2010/0085712 A1 | 4/2010 | Hrehor, Jr. et al. |
| 2012/0026670 A1* | 2/2012 | Rau et al. ................. 361/679.31 |
| 2012/0113586 A1* | 5/2012 | Rau et al. ................. 361/679.47 |

* cited by examiner

FRAME HAVING FRAME BLADES THAT PARTICIPATE IN COOLING MEMORY MODULES

CROSS-REFERENCE TO RELATED APPLICATIONS

The present patent application is related to the following patent applications: COLD PLATE HAVING BLADES THAT INTERLEAVE WITH MEMORY MODULES by Timothy Rau and Glenn C. Simon, and assigned U.S. Pat. No. 8,570,744, COOLING MEMORY MODULES USING COLD PLATE BLADES COUPLED TO THE MEMORY MODULES VIA CLIPS by Timothy Rau and Glenn C. Simon, and assigned U.S. Patent Application Publication No. 2012/0026670, and COOLING MEMORY MODULES USING WEDGE-SHAPED HEAT SPREADERS IN THERMAL CONTACT WITH COLD PLATE BLADES AND MEMORY MODULES by Timothy Rau, Glenn C. Simon, and Bryan Bolich, and assigned World Intellectual Property Organization Publication No. 2011/053313. All related applications, and the present application, were filed on Oct. 30, 2009.

BACKGROUND

In the art of computing, individual memory integrated circuits (ICs) are often provided on a dual in-line memory module (DIMM). Often a heat spreader is attached over the memory ICs to dissipate the heat generated by the memory ICs across the length of the DIMM. However, it is often desirable to provide additional cooling.

Typically, DIMM sockets are positioned on a motherboard in close proximity to each other, thereby simplifying routing of memory signal traces on the motherboard and minimizing space used by memory. A typical separation between adjacent DIMMs is 10 millimeters.

Two methods known in the art for providing additional cooling are air cooling and liquid cooling. Because of the close spacing of adjacent DIMMs, both methods often use space above the DIMM. Typically, air cooling uses a solid heat conducting metal or vapor chambers and associated tubing to conduct heat from the heat spreader to a heatsink above the DIMM.

Typically, liquid cooling uses a suitable liquid, such as propylene glycol or ethylene glycol, mixed with water, to conduct heat from the heat spreader to the liquid. The heat is removed as the liquid is pumped through a channel associated with each DIMM. The liquid is then pumped to a heat exchanger, where heat is removed from the liquid. Typically, tubing is coupled to each DIMM along the top of the top of the DIMM.

BRIEF DESCRIPTION OF THE DRAWINGS

The Figures depict embodiments, implementations, and configurations of the invention, and not the invention itself.

DETAILED DESCRIPTION

Figure 1:
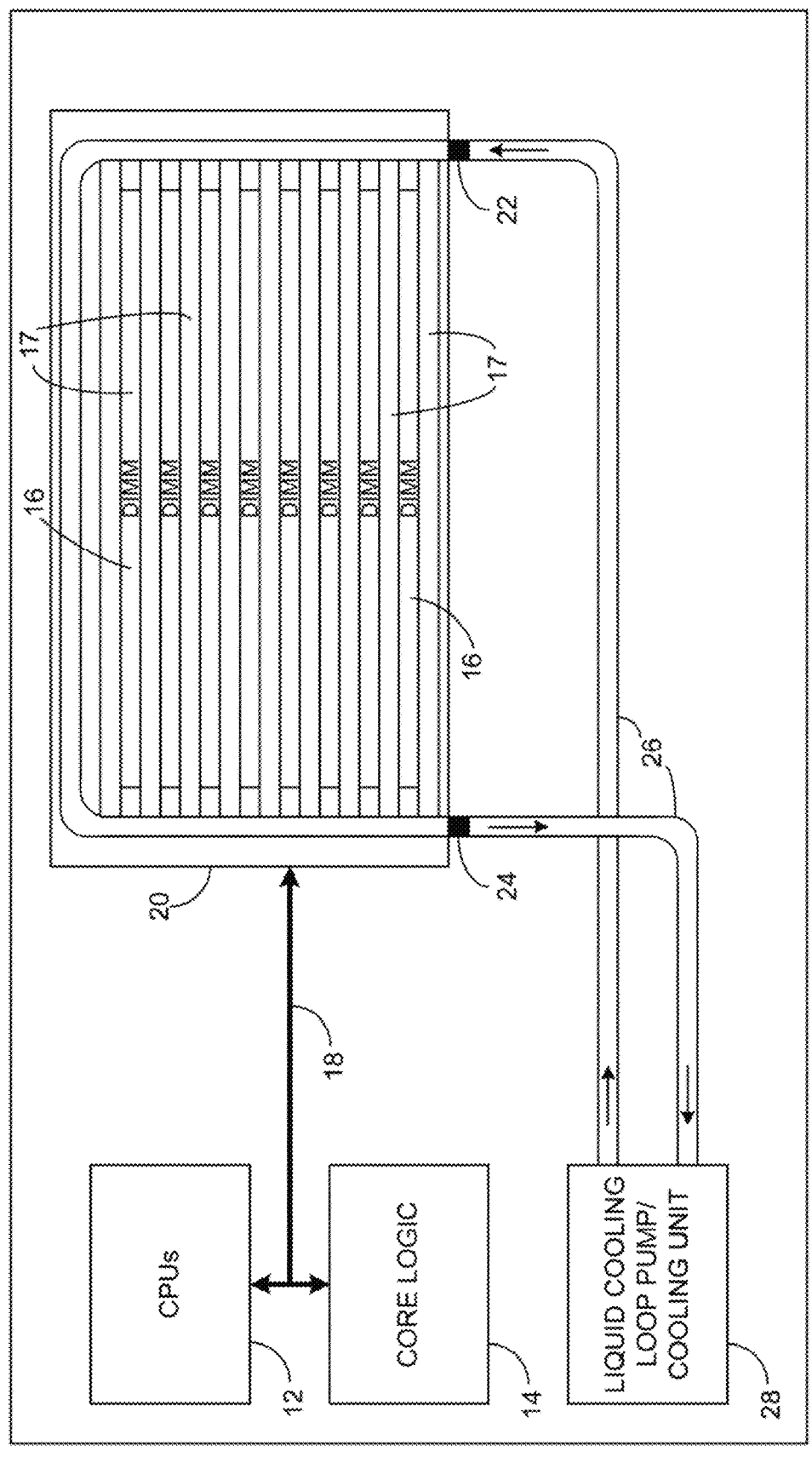
FIG. 1 is a functional block diagram of computer, having a cooling loop for cooling memory, in accordance with embodiments of the present invention.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

The Figures show many elements that are members of a plurality of similar elements. In general, individual elements will be referenced by a numeral followed by a letter, while similar elements may be referenced collectively or generically by the numeral. For example, a group of blades may be referenced as blades 36, an individual blade may be referenced as blade 36*d*, and a blade may be referenced generically as a blade 36.

As discussed in the Background section above, commercially available dual in-line memory module (DIMM) cooling solutions use space above the DIMMs to facilitate cooling. For air cooling, heatsinks are positioned above the DIMMs. Furthermore, cooling fans and air channels are often needed to move air over the heatsinks.

Commercially available liquid cooling solutions have a liquid inlet and outlet for each DIMM. The inlets and outlets, along with the associated tubing, consume space above the DIMMs. Furthermore, the need to connect tubing to the inlet and outlet of each DIMM makes assembly and servicing cumbersome.

In accordance with embodiments of the present invention, a frame having frame blades is positioned within a block of DIMMs such that the frame blades are interleaved with and positioned between the DIMMs. A cold plate having cold plate blades and a liquid inlet and outlet is positioned over the block of DIMMs such that the cold plate blades are positioned to contact sides of the DIMMs and frame blades. The cold plate blades and frame blades are wedge-shaped, with each blade having a surface that is sloped and a surface that is not sloped.

The frame blades are attached to the frame using spring-loaded mechanisms that allow the frame blades to have a certain amount of movement within the frame. Each blade of the frame has a first surface adapted to contact a heat spreader of a DIMM, and a second surface adapted to contact a cold plate blade of the cold plate.

When assembled, a cold plate/frame configuration positioned around a bank of DIMMs, in accordance with embodiments of the present invention, uses little additional space compared to a standard bank of DIMMs of the prior art. Installation and servicing are simplified, since after the cold plate is removed, DIMMs can be added or removed, as in the prior art. In addition, embodiments of the present invention may be deployed on existing board designs having sufficient space between DIMMs. A standard DIMM spacing of 10 millimeters provides sufficient space.

FIG. 1 is a functional block diagram of computer 10, in accordance with embodiments of the present invention. Details of the cold plate and frame structures, in accordance with embodiments of the present invention, will be shown in other figures.

Computer system 10 includes one or more central processing units (CPUs) 12, core logic 14, DIMMs 16, bus 18, cold plate and frame 20 (which includes blades 17, liquid inlet 22, and liquid outlet 24), tubing 26, and liquid cooling loop pump/cooling unit 28.

CPUs 12 represent CPUs know in the art, such as several CPUs in discrete packages and multi-core CPUs in a single package. Core logic 14 represents core logic known in the art, such as a south bridge, a north bridge, memory controllers, I/O controllers, and the like. As the an of computers continues to advance, some of these functions, such as the memory controllers, are provided in the CPU package. Bus 18 represents one or more buses known in the art for connecting CPUs 12, core logic 14, and DIMMs 16.

Liquid cooling loop pump/cooling unit 28 pumps and cools liquid coolant using techniques know in the art. Any suitable coolant liquid, such as propylene glycol or ethylene glycol, mixed with water, can be used. The liquid may be cooled using a simple heat exchanger and fan, or by more advanced techniques, such as Peltier coolers or heat pumps. Also, note that the function provided by unit 28 may be implemented at a variety of levels, such as in the computer system, within a rack, within a row of racks, or within a data center. It is also possible to integrate the liquid cooling function with a data center air conditioning system.

Note that it may also be desirable to cool CPUs 12 using a liquid cooling loop. In such a configuration, the loop can also flow through the CPUs, or a separate loop may be provided. For simplicity, the liquid cooling loop is only shown as cooling DIMMs 16. The liquid flows through tubing 26 in the direction show by the arrows in the tubing. The cold plate of cold plate and frame 20 includes an inlet 22 and an outlet 24, both of which are coupled to tubing 26.

The liquid cooling loop is in thermal contact with blades 17. In FIG. 1, blades 17 are shown generically in block diagram form, and include frame blades associated with the frame of cold plate and frame 20, and cold plate blades associated with the cold plate of cold plate and frame 20, as will be shown in other figures and discussed in greater detail below. Blades 17 are interleaved with DIMMs 16, and cool DIMMs 16.

Figure 2:
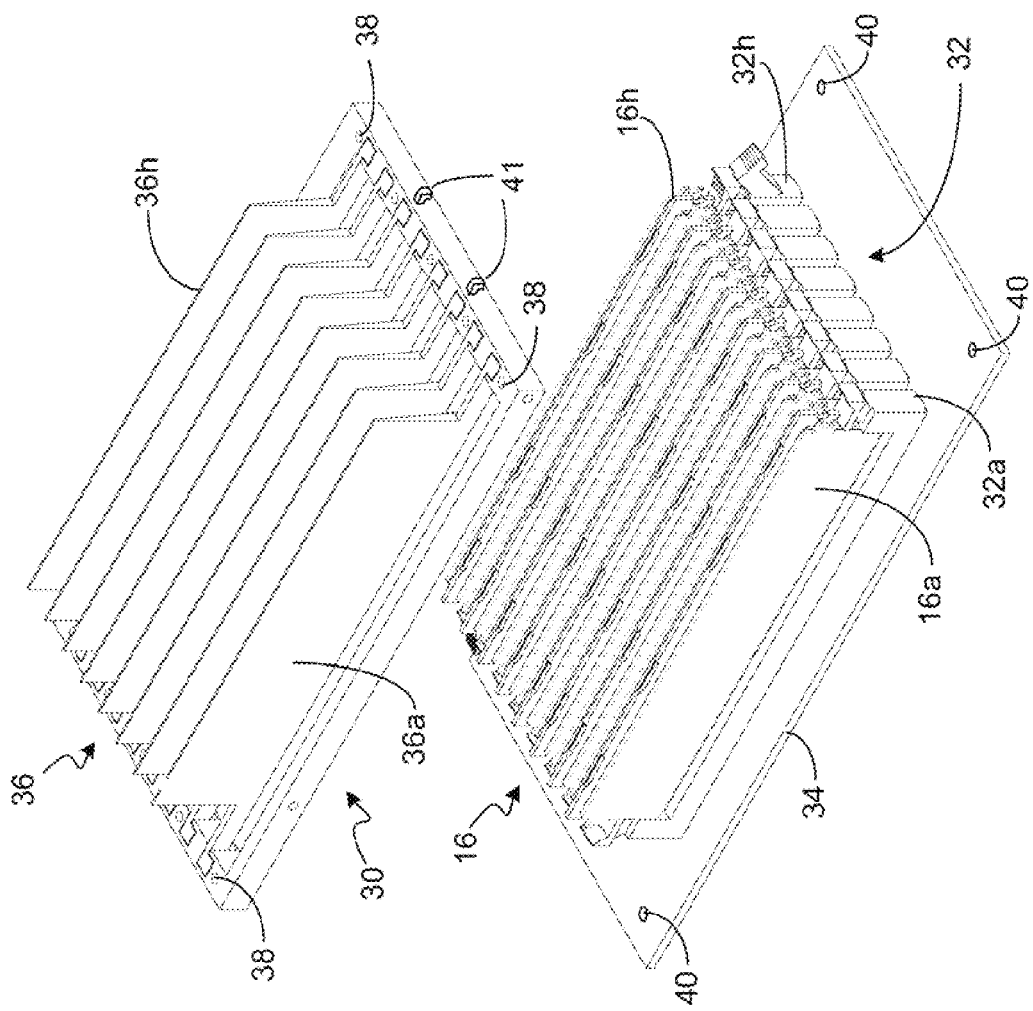
FIG. 2 shows a block of DIMMs and a frame, in accordance with embodiments of the present invention.

FIG. 2 shows a block of DIMMs 16 and a frame 30, in accordance with embodiments of the present invention. In the embodiments shown in the Figures, eight DIMMs are supported. However, those skilled in the art will recognize that additional or fewer DIMMs may be supported by embodiments on the present invention.

Block of DIMMs 16 comprises individual DIMMs 16a-16h, with labels for DIMMs 16a and 16h shown in FIG. 2. The DIMMs are installed in DIMM sockets 32, with the individual DIMM sockets labeled 32a-32h and labels for DIMM sockets 32a and 32h shown in FIG. 2. The DIMM sockets are mounted to board 34, which is a main board, motherboard, system board, or other type of circuit board.

Figure 4:
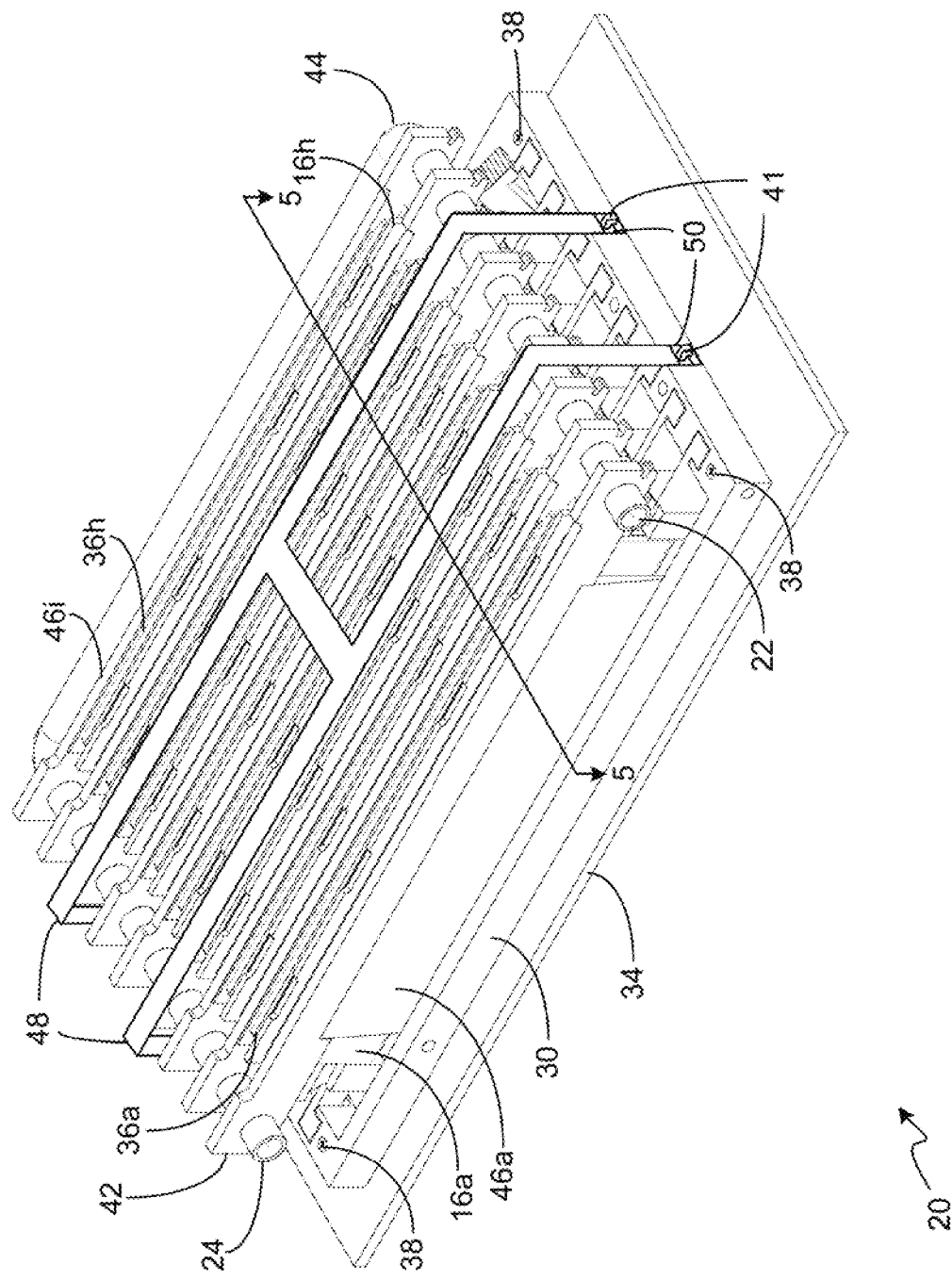
FIG. 4 shows the cold plate and frame of FIG. 3 after the cold plate has been coupled to the frame using a mounting strap, in accordance with embodiments of the present invention.

Frame 30 includes frame blades 36. One frame blade is provided for each DIMM, and the individual frame blades are labeled 36a-36h, with labels for frame blades 36a and 36h shown in FIG. 2. Frame blades 36 are mounted to frame 30 using spring-loaded mechanisms, as will be seen and discussed in greater detail below. The frame 30 includes mounting holes 38, which align with mounting holes 40 of board 34. The mounting holes are used to mount frame 30 to board 34, as will be seen below. Frame 30 also includes mounting hooks 41, which arel used to couple frame 30 to the cold plate using a mounting strap, as is shown in FIG. 4. Another pair of mounting hooks 41 are provided on the other side of frame 30 and are not shown in this figure.

Figure 3:
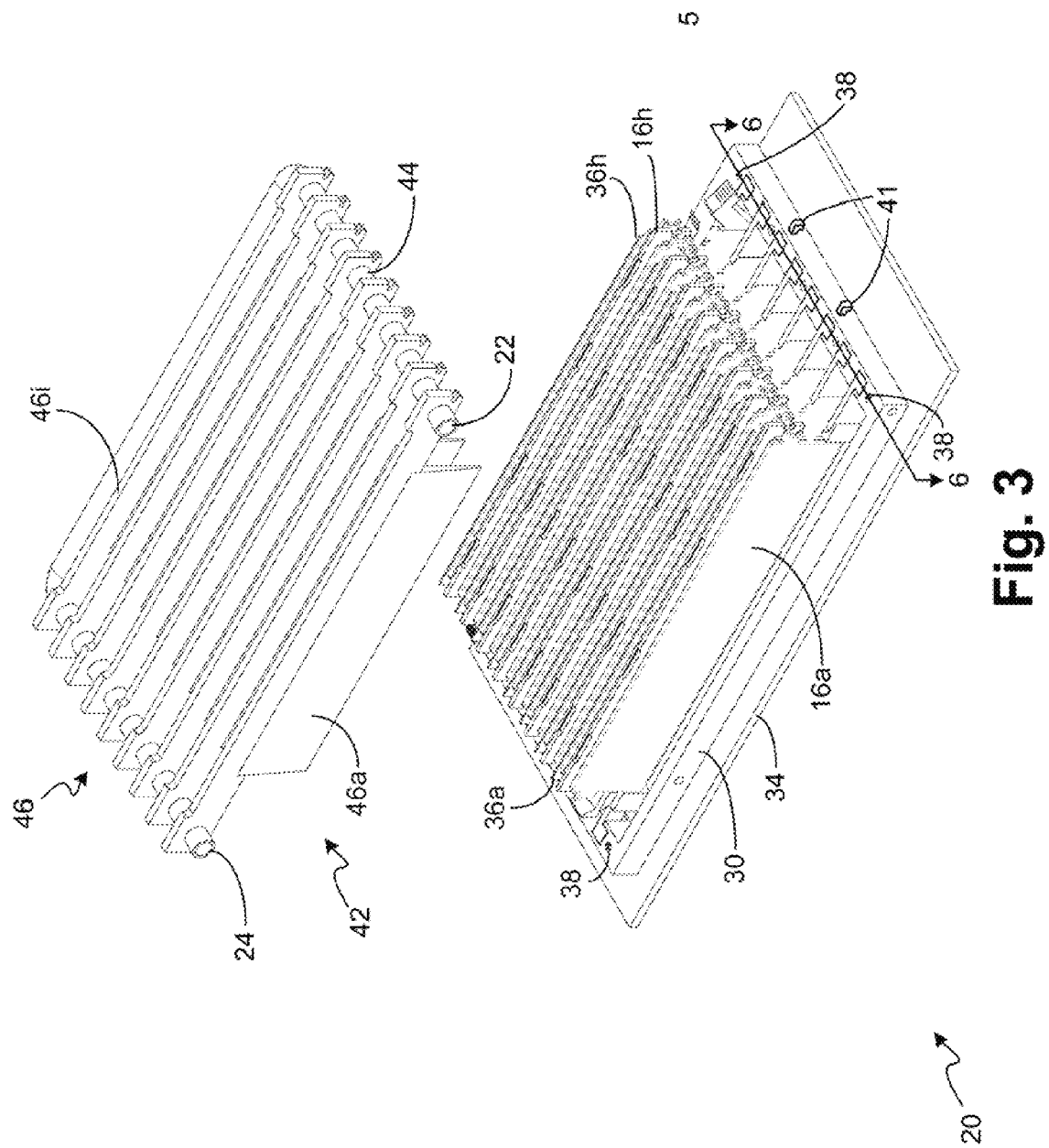
FIG. 3 shows the frame of FIG. 2 after the frame has been mounted to a board, with a cold plate shown above the frame, in accordance with embodiments of the present invention.

FIG. 3 shows frame 30 after frame 30 has been mounted to board 34. Fasteners have been inserted into mounting holes 38 of frame 30 and mounting holes 40 of board 34 (shown in FIG. 2) to attach frame 30 to board 34. Those skilled in the art will recognize that a variety of fastening mechanisms may be used to attach frame 30 to board 34.

Also shown in FIG. 3 is cold plate 42. When assembled as shown in FIG. 4, cold plate 42 and frame 30 comprise cold plate and frame 20 shown in FIG. 1. Cold plate 42 includes liquid inlet 22 and liquid outlet 24, as shown in FIG. 1. When assembled, inlet 22 and outlet 24 are connected to tubing 26, which is shown in FIG. 1. Typically, tubing 26 will include at least some portions that are flexible to facilitate installation and removal of cold plate 42.

Cold plate 42 includes cold plate blades 46. In this embodiment, the number of cold plate blades provided equals the number of DIMMs plus one. Therefore, for an eight DIMM configuration as shown in the figures, nine cold plate blades are provided. The individual cold plate blades are labeled 46a-46i, with labels for cold plate blades 46a and 46i shown in FIG. 3.

Cooling loop 44 includes inlet 22 and outlet 24, and traverses a portion of the perimeter of cold plate 42. The cooling loop is thermally coupled to each of the cold plate blades 46.

FIG. 4 shows cold plate and frame 20 after cold plate 42 has been coupled to frame 30 using mounting strap 48. Mounting strap 48 includes holes 50, through which mounting hooks 41 are positioned, thereby retaining mounting strap 48 (and cold plate 42) to frame 30. Note that only one set of mounting hooks 41 and holes 50 are visible in FIG. 4, with another set provided at the other end of the mounting strap.

Figure 5:
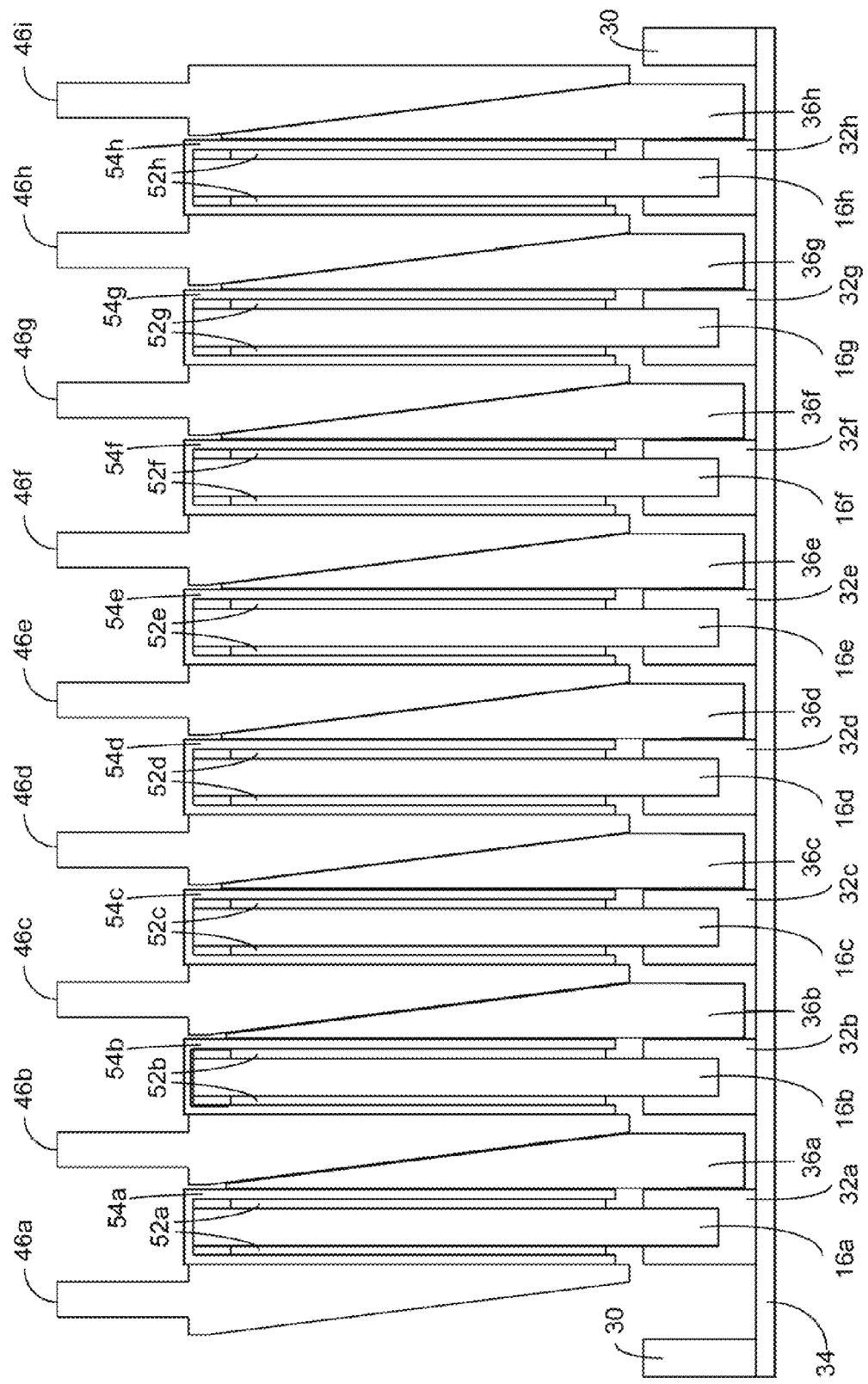
FIG. 5 is a sectional view taken along line 5-5 of FIG. 4 showing orientations of DIMMs, cold plate blades, and frame blades when the cold plate has been attached to the frame, as shown in FIG. 4, in accordance with embodiments of the present invention.

FIG. 5 is a sectional view taken along line 5-5 of FIG. 4 showing the orientations of DIMMs 16a-16h, cold plate blades 46a-46i of cold plate 42, and frame blades 36a-36h of frame 30 when cold plate 42 has been attached to frame 30. In FIG. 5, dual sided DIMMs with heat spreaders are shown. Accordingly, each DIMM (16a-16h) is inserted in a DIMM socket (32a-32h), and includes memory ICs (52a-52h) on both sides of the DIMM, and a heat spreader (54a-54h). Those skilled in the art will recognize that single-sided DIMMs may also be used with embodiments of the present invention, and DIMMs without heat spreaders may be also be used with embodiments of the present invention.

Note that before cold plate 42 is lowered into place, each DIMM 16 has one surface adjacent to a sloped surface of a frame blade 36, and another surface adjacent to a surface of a frame blade 36 that is not sloped. As cold plate 42 is lowered into place, the sloped surfaces of cold plate blades 46 contact the sloped surfaces of frame blades 36, and the surfaces of cold plate blades 46 that are not sloped contact a DIMM 16. In the installed position shown in FIGS. 5 and 4, one surface of each DIMM 16 is cooled by a thermal conduction path formed by contact with a non-sloped surface of a cold plate blade 46, and the other surface of each DIMM 16 is cooled by a thermal conduction path formed by contact with a non-sloped surface of a frame blade 36, through the sloped surface of the frame blade 36, to the sloped surface of a cold plate blade 46.

The cooperating sloped edges of the blades 36 and 46 provide lateral force to the DIMMs 16 to enhance thermal coupling. A spring-loaded mechanism, which will be discussed in greater detail with reference to FIG. 6 below, maintains the lateral force, while compensating for variations caused by thermal expansion and contraction, and variations caused by manufacturing and assembly tolerances.

Figure 6:
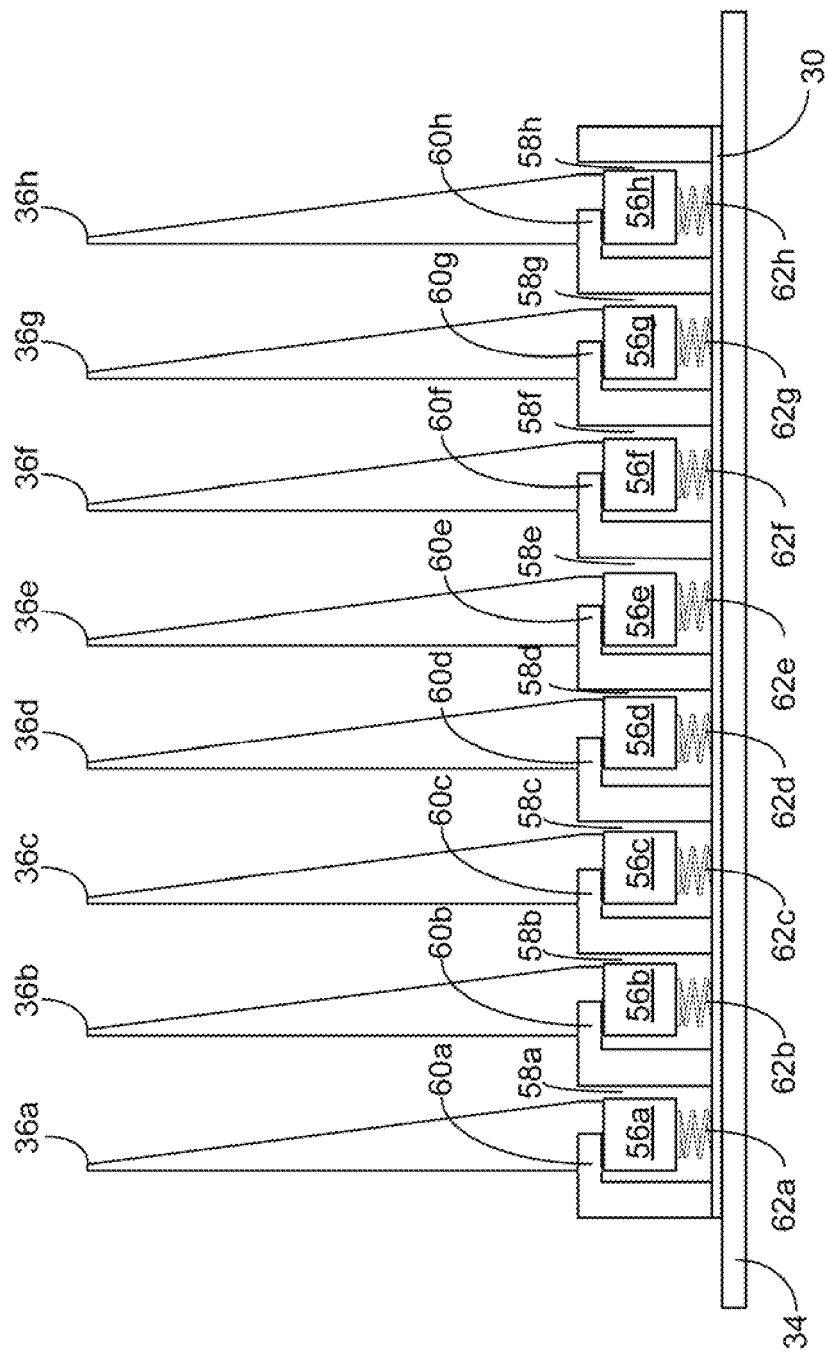
FIG. 6 is a sectional view of the frame taken along line 6-6 of FIG. 3 showing spring-loaded mechanisms that support frame blades in the frame, in accordance with embodiments of the present invention.

FIG. 6 is a sectional view of frame 30 taken along line 6-6 of FIG. 3 showing the spring-loaded mechanisms that support frame blades 36 in frame 30. Each frame blade includes a mounting member (56a-56h) that extends beyond the surfaces that contact the DIMMs 16 and cold plate blades 46. Mounting members 56 are more clearly visible in FIGS. 2-4.

Frame 30 includes a mounting cavity (58a-58h) for each mounting member 56 of each frame blade 36. Along the upper portions of mounting cavities 58 are retention surfaces (60a-60h). Retention surfaces 60 retain mounting members 56 in mounting cavities 58 during assembly and when frame 30 is not coupled to cold plate 42. Springs (62a-62h) are positioned within mounting cavities 58 and are in contact with mounting members 56. After assembly, the springs are compressed.

When cold plate 42 is coupled to frame 30, frame blades 36 are in contact with DIMMs 16 and cold plate blades 46, as shown in FIG. 5. Accordingly, springs 62 are compressed further, and a gap is present between mounting members 56 and retention surfaces 60. Since springs 62 are compressed, springs 62 continue to exert upward force, thereby maintaining the thermal conduction paths between DIMMs 16 and blades 36 and 46, as shown in FIG. 5.

Note that when cold plate 42 is coupled to frame 30, gaps will typically exist between mounting members 56, and inner walls of mounting cavities 58, retention members 60, and the base of cold plate 30. In essence, mounting members 56 are "floating" within mounting cavities 58, with upward pressure being exerted by springs 62. Accordingly, each frame blade 36 can accommodate variations caused by thermal expansion and contraction, and variations caused by manufacturing and assembly tolerances.

In the embodiments shown in FIGS. 1-4, cold plate 42 includes a single cooling loop that traverses a portion of the perimeter of the block of DIMMs 16. Each cold plate blade 46 has two ends coupled to cooling loop 44, and cold plate blades 46 are made of a material having excellent thermal transfer properties (as are frame blades 36), such as copper, aluminum, steel, and the like.

Figure 7:
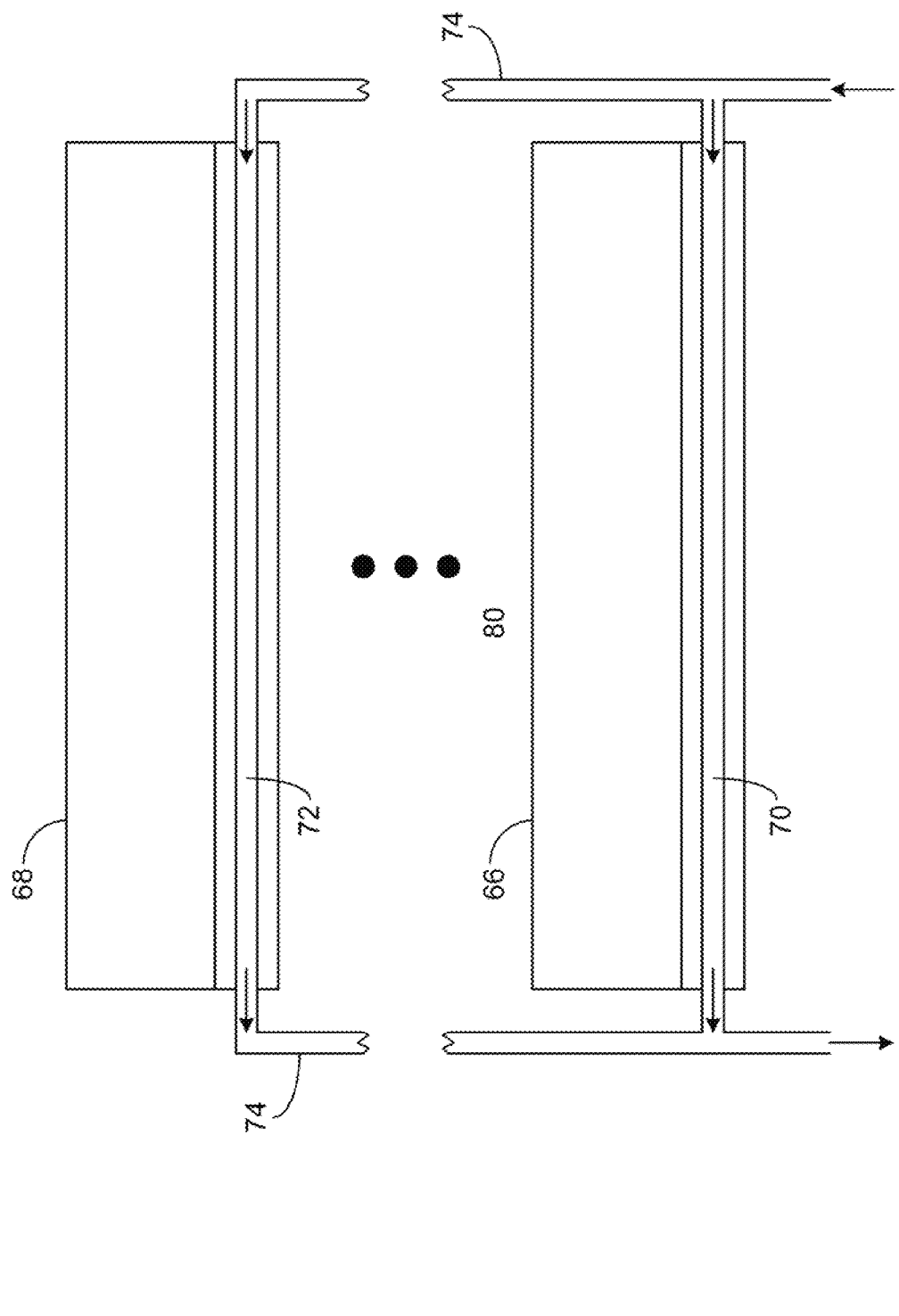
FIG. 7 is a block diagram of a cold plate wherein cooling liquid is routed through each blade, in accordance with embodiments of the present invention.

The embodiments shown in FIGS. 1-4 having a cooling loop that traverses a portion of the perimeter of the block of DIMMs provide acceptable performance. However, there is a temperature gradient between the end of the cold plate blades that are cooled by the cooling loop and the centers of the frame and cold plate blades. In another embodiment, liquid is routed through each cold plate blade of the cold plate. FIG. 7 shows a block diagram of this embodiment.

In FIG. 7, blade 66 of cold plate 64 represents a first cold plate blade in a series of cold plate blades, and blade 68 represents a last cold plate blade in the series. Blade 66 includes channel 70, and blade 68 includes channel 72, with each channel carrying cooling liquid through the blade. Cooling loop 74 is configured to route cooling liquid through the channel of each blade. Accordingly, although the embodiment shown in FIG. 7 is more complex than the embodiments shown in FIGS. 1-4, the temperatures along the length of the blades will tend to be more uniform.

Figure 8:
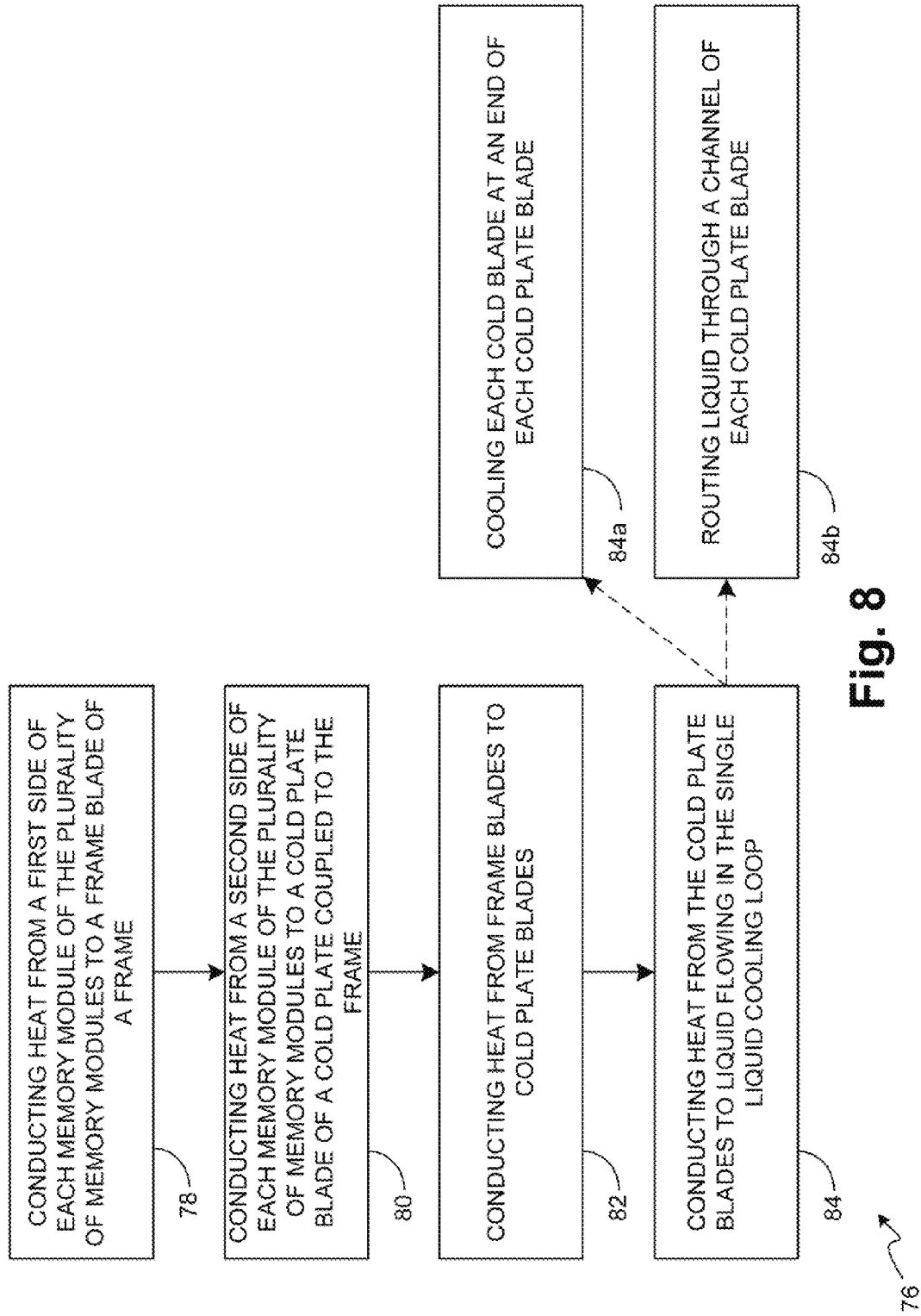
FIG. 8 is a flowchart illustrating how embodiments of the present invention cool memory modules.

FIG. 8 is a flowchart 76 illustrating how embodiments of the present invention cool DIMMs. In block 78, heat is conducted away from a first side of each DIMM to a frame blade of a frame. In block 80, heat is conducted away from a second side of each DIMM to a cold plate blade of a cold plate coupled to the frame. In block 82, heat is conducted from the frame blades to the cold plate blades. Finally, in block 84 heat is conducted from the cold plate blades to the liquid flowing in the single liquid cooling loop.

Block 84a, in conjunction with block 84, represents the embodiment shown in FIGS. 1-4. Accordingly, heat is conducted from the ends of the cold plate blades to the single liquid cooling loop. Block 84b, in conjunction with block 84, represents the embodiment shown in FIG. 7. Accordingly, cooling liquid is routed through a channel of each cold plate blade.

Embodiments of the present invention provide many advantages over the prior art. Prior art configurations provide liquid inlets and outlets for each DIMM, thereby causing the addition and removal of DIMMs to be cumbersome and time consuming. With embodiments of the present invention, a single inlet and outlet is provided for a block of DIMMs, and the cold plate can be removed and DIMMs can be added and removed without removing the inlet and outlet connections.

Embodiments of the present invention require little extra space above the DIMMs, as is shown in the Figures. Prior art air and liquid cooling solutions often consume space above the DIMMs. In addition, embodiments of the present invention have a system board "footprint" similar to prior art DIMM blocks. The only extra area required is the area reserved for the cooling loop along the sides of the cold plate, and the area reserved for the inlets and outlets, and cooling loop connections. Space is also saved by eliminating the need for cooling fans to direct airflow over the DIMMs. Of course, acoustic levels may also be reduced. Finally, embodiments of the present invention provide simple and tool-free memory configuration, since the cold plate is easily removed from the frame by removing the mounting strap and lifting the cold plate, thereby providing access to the DIMMs In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. An apparatus for cooling a plurality of memory modules comprising:
   a frame mountable to a board comprising:
      a plurality of frame blades , with individual frame blades of the plurality of frame blades interleaved between individual memory modules of the plurality of memory modules when the frame is mounted to the board and the individual memory modules are installed into memory module sockets;
   a cold pate comprising:
      a liquid cooling loop having an inlet and an outlet; and
      a plurality of cold plate blades thermally coupled to the cooling loop, with individual cold plate blades of the plurality of cold plate blades interposed between individual memory modules of the plurality of memory modules and the individual frame blades of the plurality flame blades when the cold plate is installed over and coupled to the frame, wherein the cold plate is removed to provide access to the plurality of memory modules.

2. The apparatus of claim 1 wherein the frame includes a plurality of mounting cavities, and each frame blade of the plurality of frame blades includes a pair of mounting members, with each mounting member positioned in a mounting cavity of the plurality of mounting cavities, and wherein a spring is included in each mounting cavity to urge a mounting member of each frame blade into thermal contact with a memory module of the plurality of memory modules and a cold plate blade of the plurality of blades.

3. The apparatus of claim 1 wherein at least one cold plate blade and at least one frame blade includes a sloped surface, and at least one cold plate blade and at least one frame blade includes a surface that is not sloped, and wherein a memory module of the plurality of memory modules has a first side cooled by the surface that is not sloped of a cold plate blade, and a second side cooled by the surface that is not sloped of a frame blade, wherein the sloped surface of a cold plate blade is in thermal contact with the sloped surface of a frame blade, and the sloped surfaces cooperate to apply lateral force to urge the surfaces that are not sloped into thermal contact with the first and second sides of the memory module.

4. The apparatus of claim 1 wherein the liquid cooling loop traverses at least a portion of a perimeter of the cold plate and is thermal contact with each cold plate blade proximate ends of the cold plate blades.

5. The apparatus of claim 1 wherein each cold plate blade includes a channel, and the liquid cooling loop is coupled to each cold plate blade and cooling liquid is routed through the channel of each cold plate blade.

6. A computer system comprising:
one or more central processing units;
a bank of memory module sockets mounted on a board;
core logic;
one or more busses coupling the one or more central processing units the bank of memory module sockets, and the core logic;
a frame attached to the board and having a plurality of frame blades, with individual frame blades interleaved with individual memory module sockets, the plurality of frame blades for participating in a thermal transfer path to remove heat from memory modules when the memory modules are installed;
a cold plate coupled to the frame comprising:
a plurality of cold plates; and
a liquid cooling loop having an inlet and an outlet, and in thermal contact with each of the plurality of cold plates: and
a liquid cooling loop pump and cooling unit coupled to the inlet and the outlet of the liquid cooling loop.

7. The computer system of claim 6
wherein individual cold plate blades of the plurality of cold plate blades are interposed between individual frame blades of the plurality of frame blades.

8. The computer system of claim 7 wherein the plurality of cold plate blades and the plurality of frame blades each have a sloped surface and a surface that is not sloped; the computer system. further comprising:
a plurality of memory modules inserted into memory sockets of the bank of memory sockets;
wherein each memory module has a first side cooled by thermal contact with a surface of a frame blade of the plurality of frame blades that is not sloped, and a second side that is cooled by thermal contact with a surface of a cold plate blade of the plurality of cold plate blades that is not sloped, with sloped surfaces of each of the plurality of frame blades in thermal contact with sloped surfaces of cold plate blades of the plurality of cold plate blades.

9. The computer system of claim 7 wherein the liquid cooling loop traverses at least a portion of a perimeter the cold plate and is in thermal contact with each cold plate blade proximate ends of the cold plate blades.

10. The computer system of claim 7 wherein each cold plate blade includes a channel, and the liquid cooling loop is coupled to each cold plate blade (66, 68) and cooling liquid is routed through the channel of each cold plate blade.

11. The computer system of claim 7 wherein the cold plate is retained to the frame using a mounting strap.

12. The computer system of claim 6 wherein the frame includes a plurality of mounting cavities, and each frame blade of the plurality of frame blades includes a pair of mounting members, with each mounting member positioned in a mounting cavity of the plurality of mounting cavities, and wherein a spring is included in each mounting cavity.

13. A method for removing heat from a plurality of memory modules interleaved with frame blades of a frame attached to a board and cooled by a single liquid cooling loop comprising:
conducting heat from a first side of each memory module of the plurality of memory modules to a frame blade of the frame;
conducting heat from a second side of each memory module of the plurality of memory modules to a cold plate blade of a cold plate coupled to the frame;
conducting heat from frame blades to cold plate blades; and
conducting heat from the cold plate blades to liquid flowing in the single liquid cooling loop,
wherein the cold plate blades are interposed between individual memory modules of the plurality of memory modules and individual frame blades when the cold plate is installed over and coupled to the frame.

14. The method of claim 13 wherein conducting heat from the cold plate blades to liquid flowing in the single liquid cooling loop includes cooling each cold blade at an end of each cold plate blade.

15. The method of claim 13 wherein conducting heat from the cold plate blades to liquid flowing in the single liquid cooling loop includes routing liquid through a channel of each cold plate.

* * * * *

UNITED STATES PATENT AND TRADEMARK OFFICE
CERTIFICATE OF CORRECTION

PATENT NO. : 8,767,403 B2  
APPLICATION NO. : 13/260207  
DATED : July 1, 2014  
INVENTOR(S) : Timothy Rau et al.

Page 1 of 1

It is certified that error appears in the above-identified patent and that said Letters Patent is hereby corrected as shown below:

In the Claims

In column 6, line 57, in Claim 1, delete "blades ," and insert -- blades, --, therefor.

In column 6, line 63, in Claim 1, delete "pate" and insert -- plate --, therefor.

In column 7, line 3, in Claim 1, delete "flame" and insert -- of frame --, therefor.

In column 7, line 30, in Claim 4, delete "is" and insert -- is in --, therefor.

In column 7, line 41, in Claim 6, delete "units" and insert -- units, --, therefor.

In column 7, line 53, in Claim 6, delete "plates:" and insert -- plates; --, therefor.

In column 8, line 4, in Claim 8, delete "system." and insert -- system --, therefor.

In column 8, line 18, in Claim 9, after "perimeter" insert -- of --.

In column 8, line 23, in Claim 10, after "blade" delete "(66, 68)".

Signed and Sealed this  
Sixteenth Day of December, 2014

Michelle K. Lee  
*Deputy Director of the United States Patent and Trademark Office*